United States Patent [19]
Nielson

[11] Patent Number: 5,614,868
[45] Date of Patent: Mar. 25, 1997

[54] PHASE LOCKED LOOP HAVING VOLTAGE CONTROLLED OSCILLATOR UTILIZING COMBINATIONAL LOGIC

[75] Inventor: Edward T. Nielson, Vence, France

[73] Assignee: VLSI Technology, Inc., San Jose, Calif.

[21] Appl. No.: 547,418

[22] Filed: Oct. 24, 1995

[51] Int. Cl.$^6$ .............................. H03B 5/24; H03L 7/099
[52] U.S. Cl. ............................. 331/1 A; 331/57; 331/74; 327/158; 327/159
[58] Field of Search ................................ 331/1 A, 25, 34, 331/45, 57, 60, 74, 177 R; 327/105, 116, 156–159

[56] References Cited

U.S. PATENT DOCUMENTS 5,262,735  11/1993  Hashimoto et al. ................... 331/74 X
5,448,191   9/1995  Meyer .................................... 331/74 X

OTHER PUBLICATIONS

Gardner, Floyd M., "Charge–Pump Phase–Lock Loops," IEEE action on Communications, Nov. 1980, vol. COM–28, No. 11, pp. 1849–1858.

Chie, Chak M., et al., "Phase–Locked Loops: Applications, Performance Measures, and Summary of Analytical Results," IEEE Press, Nov. 1986 pp. 3–25.

*Primary Examiner*—David Mis
*Attorney, Agent, or Firm*—Hickman Beyer & Weaver

[57] ABSTRACT

A phase locked loop including a VCO having a multi-stage oscillator portion and a combinational logic portion. The multi-stage oscillator portion is configured to oscillate at a VCO clock frequency during a steady state condition under the control of a VCO control signal, and is further operative to develop a plurality of clock phases at the VCO clock frequency, with one of such clock phases used in the determination of the VCO control signal. The combinational logic portion is responsive to at least some of the plurality of clock phases and is operative to combine clock phases to create an output clock having an output clock frequency that is a multiple of the input clock frequency. A method for multiplying an input clock frequency includes the steps of applying an input clock to a delay chain, developing a plurality of phase-shifted clocks by tapping into the delay chain, and combining the plurality of phase-shifted clocks in combinational logic to produce an output clock having a frequency that is a multiple of the input clock frequency. A method for making a VCO includes producing a looped chain of delay elements that can provide oscillation, where an output of a delay element is phase-shifted relative to the output of a preceding delay element, producing combinational logic, and coupling a plurality of the delay element outputs to the combinational logic such that the frequency of the combined signal is a multiple of the VCO oscillation frequency.

34 Claims, 4 Drawing Sheets

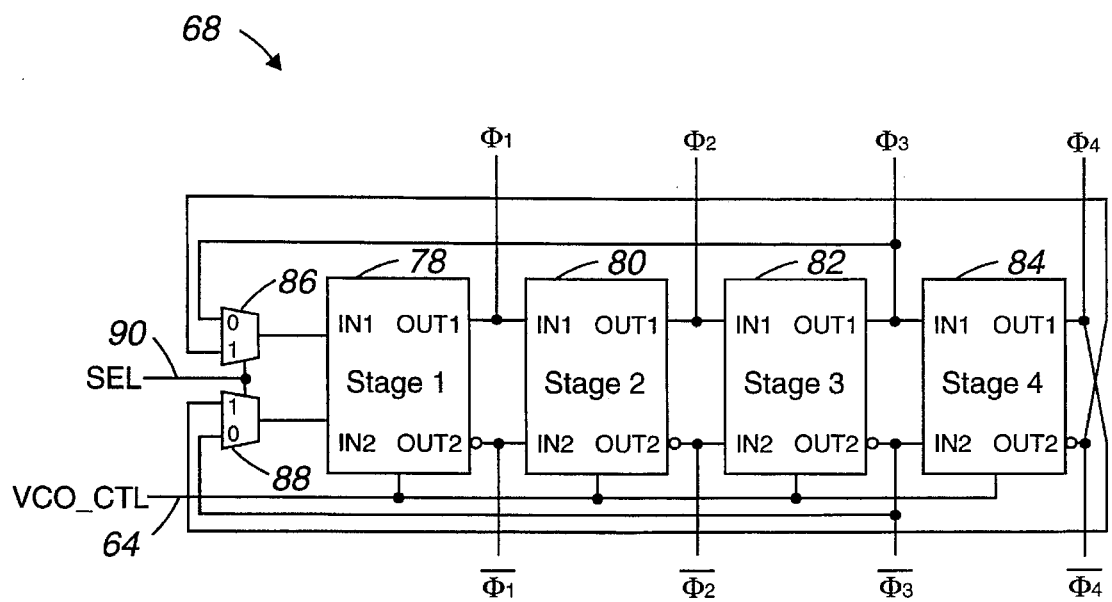
Fig. 5
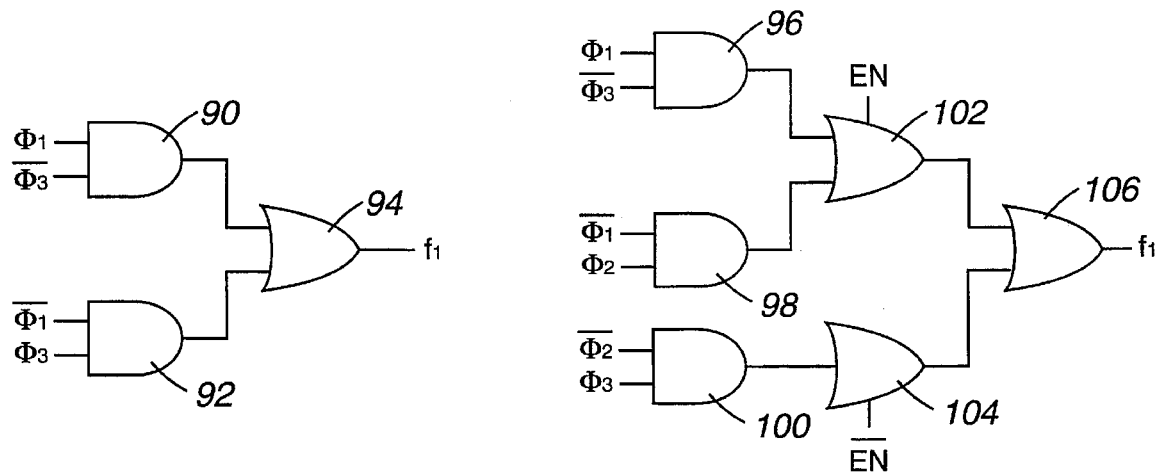
Fig. 6a
Fig. 6b

PHASE LOCKED LOOP HAVING VOLTAGE CONTROLLED OSCILLATOR UTILIZING COMBINATIONAL LOGIC

TECHNICAL FIELD

This invention relates generally to phase locked loops, and more particularly to voltage controlled oscillators for phase locked loops.

BACKGROUND ART

Phase locked loops are used in electronic circuitry for a variety of purposes. For example, phase locked loops are used for frequency multiplication, de-skewing, phase alignment, and a number of other applications well known to those skilled in the art.

A phase locked loop or "PLL" 10 of the prior art is illustrated in FIG. 1. A more detailed description of phase locked loops can be found in the article "Phase-Locked Loops: Applications, Performance, Measures, And Summaries 0f Analytical Results," Chak M. Chie and William C. Lindsey, *Phase-Locked Loops*, IEEE Press, 1985. The particular phase locked loop illustrated in FIG. 1 is used for frequency multiplication.

In FIG. 1, the PLL 10 includes an input signal 12 at a frequency $f_0$ which is divided by a factor "M" in a divider 14 to create an input clock 16 of frequency $f_0/M$. The input clock 16 is one input to a comparator 18. An output 20 of comparator 18 controls a loop filter 22 which produces a control signal 24. A voltage controlled oscillator or "VCO" 26 is controlled by the control signal 24 and produces an output clock $f_1$ having a frequency $f_1 = Nf_0/M$. This output clock frequency $f_1$ is, therefore, a multiple that is "N" times the input clock frequency of $f_0/M$. The output clock is divided by the factor "N" in a divider 28 to produce a comparison clock 30 having a frequency of $f_0/M$. The comparison clock 30 is compared with the input clock 16 to develop the comparator output 20.

It is apparent from the diagram of FIG. 1 that the divider 28 determines the frequency of operation of the VCO by the size of the divisor "N". Therefore, if an input clock frequency of, for example, 10 megahertz is provided, and if N=4, the output clock frequency $f_1$ and the frequency of operation of VCO 26 will be 4 times the input clock frequency, or 40 megahertz.

In FIG. 2, a prior art VCO 26 includes four latches 32, 34, 36, and 38, which are also labeled as stages 1, 2, 3, and 4, respectively. The latches 32–28 are chained together such that (except for stage 1) the inputs of each stage are coupled to the outputs of the preceding stage. The output of the last stage 4 is coupled back to the inputs of stage 1. In other words, the "chain" of stages is formed into a "loop" to provide the necessary feedback ("feedback loop") for oscillation. Since an inversion is necessary for oscillation, the outputs of stage 4 are crossed before being coupled to the inputs of stage 1. Each of the latches (stages) have an inherent delay, the length of which is controlled by a VCO control signal VCO—CTL on line 24.

A problem encountered with the prior art PLL 10 is that the VCO 26 oscillates at the high frequency level $f_1$, which is N times the input clock frequency. In the current example, if the input clock frequency is 10 megahertz, the output clock frequency $f_1$ is 40 megahertz. Since power consumption of in an electronic circuit is directly related to its frequency of operation, this high frequency operation can be quite disadvantageous in that it causes the circuit to consume a great deal of energy. This is a particular problem with battery-powered circuitry such as with portable computers.

Moreover, as operating frequencies continue to increase, e.g. into the 100 MHz, 200 MHz, and even higher frequency ranges, the frequency of operation of PLLs will become a more universal problem. This is because, in addition to increased power consumption at higher frequencies, high frequency PLL operation further suffers from other problems, including heat generation, electromagnetic interference (EMI) generation, and the difficulty of designing and manufacturing the electronic circuitry of the PLL to operate at such high frequencies.

The above-mentioned problems with prior art PLL designs are made worse when phase-shifted clocks are also required from the PLL. For example, to provide a first 50 megahertz output clock and a second 50 megahertz clock that is one quarter of a cycle (i.e. 90 degrees) out of phase with the first output clock, a conventional PLL would have to operate its VCO at 200 megahertz. The output clock could then be divided down to obtain the two clocks. Operating a VCO at 200 megahertz will cause the PLL to exhibit many of the aforementioned disadvantages, including high energy consumption, heat production, and EMI. In addition, the PLL would tend to be expensive to manufacture due to the exotic devices and manufacturing techniques that would be required to operate the PLL at such high frequencies.

DISCLOSURE OF THE INVENTION

The present invention provides an improved PLL which has a VCO which can operate at the same frequency as the input clock (or at some relatively low multiple of the input clock frequency) while providing an output clock at a multiplied frequency. The PLL and VCO of the present invention, therefore, consume less energy, generate less heat, generate less EMI, and tend to be easier and less expensive to manufacture than their counterparts in the prior art.

A phase locked loop ("PLL") in accordance with the present invention includes a comparator, a VCO controller, and a voltage controlled oscillator ("VCO") having a multistage oscillator portion and a combinational logic portion. The comparator is responsive to an input clock and a VCO clock and is operative to compare the frequencies of the two clocks to develop a comparator output signal. The VCO controller (preferably a loop filter) is responsive to the comparator output signal and produces a VCO control signal which controls the frequency of oscillation of the multistage oscillator portion of the VCO. The multi-stage oscillator portion, in one embodiment of the present invention, is designed to oscillate at the VCO clock frequency during a steady-state condition of the PLL, and develops a plurality of clock phases at the VCO clock frequency. The combinational logic portion is responsive to at least some of the plurality of clock phases generated by the oscillator portion and is operative to combine the phases to create an output clock having an output clock frequency that is a desired multiple of the input clock frequency.

A voltage controlled oscillator of the present invention includes a multistage oscillator portion configured to oscillate at a VCO clock frequency under steady-state conditions and to develop a plurality of clock phases at the VCO clock frequency, and a combinational logic portion responsive to at least some of the plurality of clock phases and operative to combine at least some of the clock phases to create an output clock having a output clock frequency that is a multiple of the VCO clock frequency. Preferably, the oscillator portion includes a plurality or "chain" of latches, where an input of each latch except a first latch is coupled to an output of a preceding latch. An input of the first latch is coupled to an output of the last latch to provide the necessary feedback loop for oscillation. Each of the latches provides a delay having a period controlled by the VCO control signal. The plurality of clock phases are taken from the outputs of the latches.

A method for multiplying an input clock frequency in accordance with the present invention includes the steps of applying an input clock at an input clock frequency to a delay chain, developing a plurality of phase-shifted clocks by tapping into the delay chain, and combining the plurality of phase-shifted clocks in combinational logic to produce an output clock having an output clock frequency that is a multiple of the input clock frequency. The delay chain is preferably provided by looped chain of latches, each of which provides a unit of delay. However, other types of delay chains (such as a series of inverters) can also be used.

A method for making a voltage controlled oscillator comprises the steps of producing an oscillating chain of latches as a portion of an electronic circuit, where an output of each latch is phase-shifted relative to its input, producing combinational logic as a portion of the electronic circuit, and coupling a plurality of phase-shifted clocks to the combinational logic such that an output of the combinational logic is a multiple of the frequency of oscillation of the chain of latches.

An advantage of the present invention is that frequency multiplication can be accomplished without operating a voltage controlled oscillator of a phase locked loop at the output frequency. In addition, multiple phases of a desired output frequency can be obtained from the multiple clock phases provided by the VCO of the present invention.

These and other advantages of the present invention will become apparent upon reading the following detailed descriptions and studying the various figures of the drawings.

BRIEF DESCRIPTION OF THE DRAWINGS.

FIG. 5 is a schematic of a multi-stage oscillator portion of a VCO in accordance with the present invention;

FIGS. 6a and 6b are two examples of the combinational logic portion of VCO in accordance with the present invention.

BEST MODES FOR CARRYING OUT THE INVENTION

Figure 1:
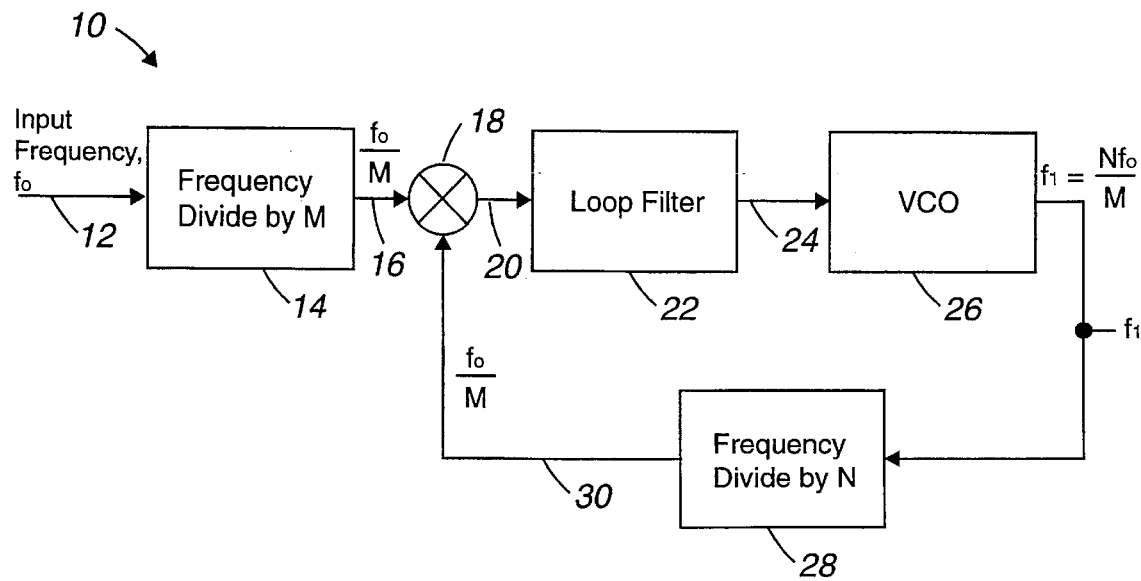
FIG. 1 is a block diagram of a phase locked loop ("PLL") of the prior art.
Figure 2:
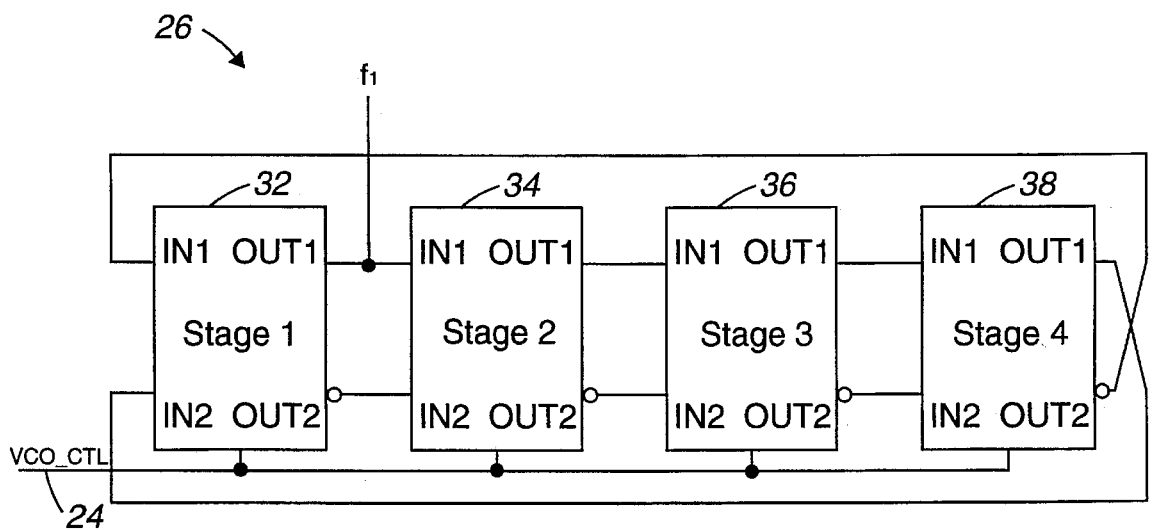
FIG. 2 is a schematic of voltage controlled oscillator ("VCO") of the prior art.
Figure 3:
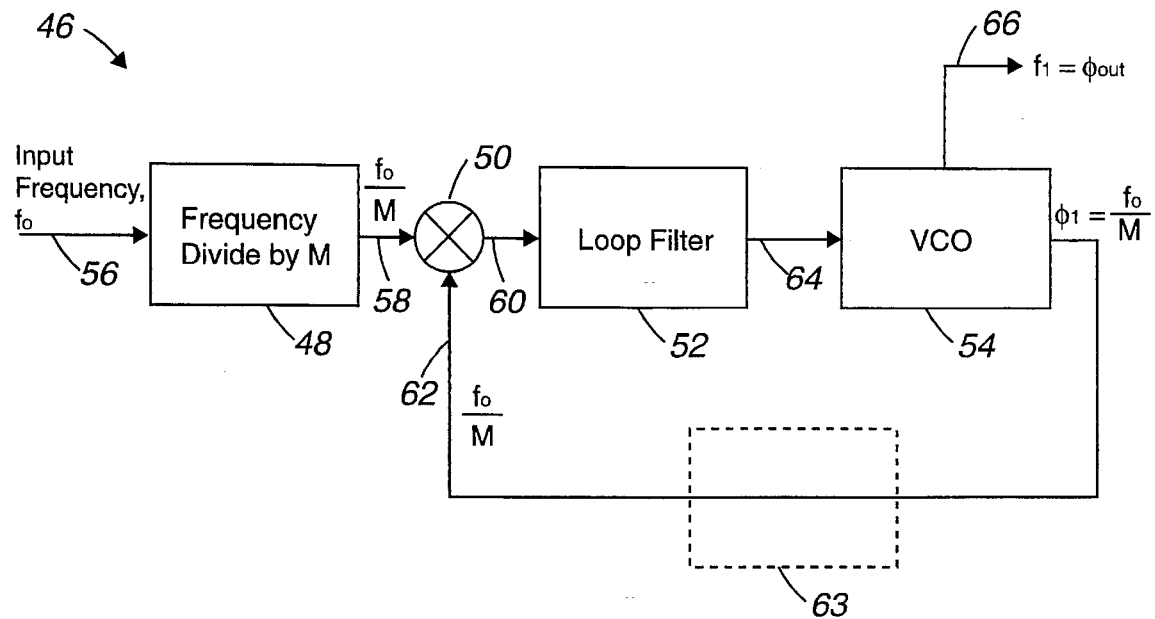
FIG. 3 is a block diagram of a PLL of the present invention.

FIGS. 1 and 2 were discussed with respect to the prior art. In FIG. 3, a phase locked loop or "PLL " 46 in accordance with the present invention includes a frequency divider 48, a comparator 50, a loop filter 52, and a voltage controlled oscillator or "VCO" 54. An input signal of frequency $f_0$ is input on a line 56 into frequency divider 48 to provide an input clock of a frequency $f_0/M$ on a line 58. The input signal of frequency $f_0$ is typically provided by a crystal oscillator and is typically divided by "M" to provide a suitable input clock frequency for multiplication by "N" in the VCO 54. In many instances, N=1, eliminating the need for a feedback divider. However, by dividing by M and multiplying by N, a great number of output clock frequencies can be generated from a given crystal oscillator. The design and use of crystal oscillators and the design and use of frequency dividers such as frequency divider 48 are well known to those skilled in the art.

A comparator 50 has, as a first input, the input clock on line 58 and has, as an output, a comparator output signal on a line 60. As will be discussed in greater detail subsequently, the comparator 50 also has a second input of a VCO comparison clock that is developed by VCO 54 on a line 62.

The design and use of comparators such as comparator 50 are well known to those skilled in the art. Simply stated, the comparator 50 compares the frequency of the input clock on line 58 to the VCO comparison clock on line 62. If the input clock frequency, for example, is greater than the VCO comparison clock frequency, a first type of signal is provided on line 60. If the input clock frequency is less than the VCO comparison clock frequency, a second type of signal will be provided on line 60. In other words, the comparator output signal reflects the relative frequencies of the input clock and the VCO comparison clock.

As will be discussed subsequently, the comparator output ultimately causes an adjustment in the frequency of oscillation of the VCO 54 so that, during a steady-state operation of the PLL 46, the frequency of oscillation of the VCO 54 is essentially the same frequency as the frequency of the input clock 58 when N=1. By "essentially" or "about", it meant that within practical tolerances, the frequencies are as specified. However, since in the real world there are always factors such as skew, thermal and electrical fluctuations, etc. to contend with, the frequencies may not be exactly as specified at any particular instant in time. However, they will be very close to being as specified. Since the VCO 54 is oscillating at about the same frequency as the input clock when N=1, it will be apparent that the VCO 54 will exhibit the numerous advantages of low frequency operation discussed previously.

The design and use of loop filters such as loop filter 52 are also well-known to those skilled in the art. The comparator output signal is input into loop filter 52 and, as discussed below, the loop filter 52 ("VCO controller") produces a VCO control signal on a line 64 which effects the frequency of oscillation of the VCO circuit.

The operation of the comparator 50 and loop filter 52 will be therefore be explained herein simplified terms since their operation is well known to those skilled in the art. The comparator 50 can be thought of as developing a "digital" signal indicating either a "charge" or "discharge" of the loop filter should be accomplished. This "digital" signal can be thought of as corresponding to the first and second types of signals described earlier. If, for example, the VCO 54 is oscillating too slowly, the comparator will create a first type of signal ("charge") to cause a current source of the loop filter 52 to "charge up" and appropriately adjust the voltage of the VCO control signal on line 64. If the VCO 54 is oscillating too fast, the comparator will create a second type of signal ("discharge") which will discharge loop filter, again appropriately adjusting the voltage of the VCO control signal on line 64. Therefore, the PLL includes a feedback loop which causes the VCO 54 to oscillate at the appropriate frequency during steady-state conditions.

The VCO 54 produces the VCO comparison clock on a line 62 and also includes an output clock $f_1$ on a line 66. This output clock $f_1$ will be alternatively referred to as $\phi_{OUT}$. The VCO clock on line 62 will also be referred to as $\phi 1$ which, as noted, is the same as the input clock frequency, i.e. $f_0/M$. It should be noted that since the VCO 54 can operate at the input clock frequency, the frequency divider (such as frequency divider 28 of FIG. 1) that was required in the prior art is not required for the present invention.

Nonetheless, it should be also noted that an optional frequency divider ("feedback divider") 63 can be provided in the present invention. In that instance, the output of the VCO is coupled to an input of the frequency divider 63, and the output of the frequency divider 63 is coupled to line 62, i.e. to an input of the comparator 50. While it is not necessary to run the VCO 54 at a frequency higher than the input clock 58, it may be desirable to do so to obtain a desired VCO output clock frequency. For example, odd frequency multiples such as 1.75, 2.25, 1.67, etc. can be obtained for the VCO output clock by choosing proper values for M (of divider 48) and N (of divider 63) for a given input frequency from a crystal or other type of input frequency oscillator.

Figure 4:
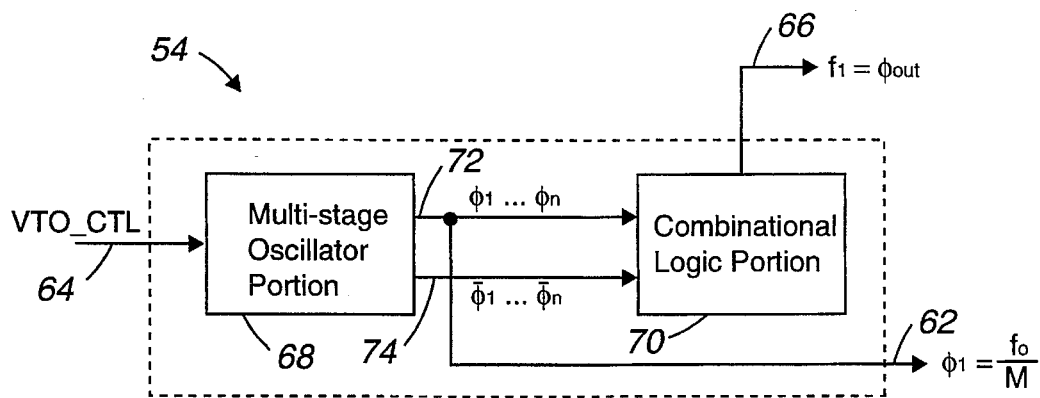
FIG. 4 is a block diagram of a VCO of the present invention.

In FIG. 4, the VCO 54 of the present invention is illustrated in greater detail. More particularly, the VCO 54 includes a multi-stage oscillator portion 68 and a combinational logic portion 70. The multi-stage oscillator portion includes many of the same elements of a latch-type VCO 26 of the prior art. However, unlike the prior art, which often has a single output from the VCO, the oscillator portion 68 of the present invention produces a number of phases $\phi 1$, $\phi 2$, $\phi 3 \ldots \phi n$ on an output bus 72 and the complements (also known as "inverses" or "inversions") of these clock phases on a bus 74. In the present description, the complement or inversion of a signal will be indicated by an "*" in the specification and claims, but will be shown in the figures with an "inversion bar" (a horizontal line drawn over the particular signal to indicate its inversion). For example, the complement of the clock phase $\phi 1$ will be designated in the specification and claims as $\phi 1^*$, and will be shown in the drawings with the well-known inversion bar.

The VCO clock on line 62 is simply $\phi 1$ from the multi-stage oscillator portion 68. However, the output clock $f_1$ (also known as $\phi_{OUT}$) is produced by the combinational logic portion 70 from one or more phases of the phase clocks on buses 72 and 74. Both the multi-stage oscillator portion 68 and the combinational clock 70 will be discussed in greater detail with reference to subsequent figures.

In FIG. 5, a multi-stage oscillator portion 68 in accordance with the present invention includes four latches 78, 80, 82, and 84, which are also referred to herein as stages 1, 2, 3, and 4, respectively. Each of the stages has a pair of inputs IN1 and IN2, and a pair of outputs OUT1 and OUT2. For a given stage, OUT1 is the inverse of IN1, OUT2 is the inverse of IN2, and OUT2 is the complement of OUT1 as indicated by the open "bubble" on the OUT2 outputs. This is in accordance with standard latch-type VCO design. Each of the latches 78–84 also include a control input coupled to the VCO control signal VCO—CTL on line 64. As it is well-known to those skilled in the art, the delay of each of the stages 78–84 will decrease as the voltage level on line 64 increases and will increase as the voltage level on line 64 decreases.

With the exception of stage 1, the inputs of each stage are coupled to the outputs of the preceding stage. In other words, input IN1 of each stage is coupled to output OUT 1 of the preceding stage, and input IN2 of each stage is coupled to the output OUT2 of the preceding stage. An inversion is performed at each stage, as was explained previously.

The oscillator portion 68 further includes a first multiplexer 86 and a second multiplexer 88 having their respective outputs coupled to the input IN1 of stage 1 and to the input IN2 of stage 1. The multiplexers are controlled by a common control signal SEL on a line 90 to allow the oscillator portion 68 to operate as a three-stage or as a four-stage oscillator. When the signal SEL on line 90 is high ("1") output OUT2 of stage 4 is coupled to input IN1 of stage 1 and output OUT1 of stage 4 is coupled to input IN2 of stage 1. When the value of SEL is low ("0") the output OUT1 of stage three is coupled to the input IN1 of stage 1, and the output OUT2 of stage 3 is coupled to the input IN2 of stage 1.

It should be noted that when the oscillator portion 68 is operated with three stages, the outputs of stage 3 are fed directly into corresponding inputs of stage 1. However, if four stages are to be used, the outputs of stage 4 are crossed before they are coupled into the inputs of stage 1. This is because, for proper oscillation, an inversion of the signal in the last stage must be applied to the inputs of the first stage. Since each stage has its own inherit inversion, if an odd number of stages are used the inversion happens automatically. However, if an even number of stages are used, the outputs need to be inverted (either with inverters or by it being crossed as shown) before being applied back to the input of stage 1.

It should also be noted that each of the outputs of each of the stages has a "tap" to provide a plurality of clock phases. In other words, the oscillator portion 68 is an example of a multi-stage delay chain with multiple taps to provide multiple clock phases, i.e. one instance of a circuit for developing a plurality of phase-shifted clocks by tapping into a chain of delay elements. The output OUT1 of stage 1 is labeled as $\phi 1$, the output OUT1 of stage 2 is labeled as $\phi 2$, the output OUT1 of stage 3 is labeled as $\phi 3$, and the output OUT1 of stage 4 is labeled as $\phi 4$. The complements $\phi 1^*$–$\phi 4^*$, of clock phases $\phi 1$–$\phi 4$ are taken from the outputs OUT2 of the corresponding stages, as shown in the figure.

FIGS. 6a and 6b illustrate two examples of combinational logic utilizing the phase clocks on buses 72 and/or 74 to provide an output frequency $f_1$ that is a multiple of the input frequency. As it is well-known to those skilled in the art, "combinational" (or "combinatorial") logic refers to the combination of unclocked logic gates such as AND, OR, NAND, NOR, XOR, or their logical equivalents. Therefore, the signals propagating through combinational logic are not strictly in phase with the input clock. However, if the combinational logic is fast and not too complicated, the delay or "skew" of the combinational logic will be negligible and can be safely ignored in most instances.

In FIG. 6a, combinational logic including two AND gates 90 and 92 and an OR gate is shown. The AND gate 90 has inputs coupled to the clock phases $\phi 1$ and $\phi 3^*$, and AND gate 92 has inputs coupled to the clock phases $\phi 1^*$ and $\phi 3$. The outputs of AND gates 90 and 92 are the inputs to OR gate 94, and the output of OR gate 94 is the output clock $f_1$. The combinational logic of FIG. 6a will be operative to produce an output frequency $f_1$ which is twice the input frequency of the input clock to the PLL 46 when the signal SEL on line 90 is high, i.e. when the oscillation portion 68 is in a four-stage mode.

FIG. 6b is another example of combinational logic which can be used when the signal SEL on line 90 of FIG. 5 is low, i.e. when the oscillator portion 68 is operating in a three-stage mode. The combinational logic of FIG. 6b includes three AND gates 96, 98, and 100 and three OR gates 102, 104, and 106. The OR gates 102 and 104 are enabled by the signals EN and EN*, respectively. More particularly, the inputs of AND gate 96 are $\phi1$ and $\phi3$*. The inputs of AND gate 98 are $\phi1$* and $\phi2$, the inputs of AND gate 100 are $\phi2$* and $\phi3$, the inputs to OR gate 102 are the outputs of AND gates 96 and 98, the input of OR gate 104 is the output of AND gate 100, and the inputs of OR gate 106 are the outputs of OR gates 102 and 104. The output of OR gate 106 is the output clock $f_1$.

In operation, the combinational logic of FIG. 6b will produce an output frequency of 1.5 times the input clock. This is accomplished "masking" alternate half cycles with the EN and EN* signals derived from a toggle device connected to other phases. In the present example, EN is provided by the output of a "toggle" flip-flop with $\phi1$ as its input, and EN* is provided by the output of a toggle flip-flop with $\phi3$* as an input.

As will be apparent from the foregoing examples, there are great many of combinational logic configurations that can be used to provide different output frequencies. These output frequencies $f_1$ can be integer multiples of the input clock or can be non-integer multiples of the input clock. By combining or expanding combinational logic, multiple output frequencies and/or phases can be provided.

The components and interconnections of the combinational logic used to produce a particular output clock tend to fall into certain patterns. For example, with an n-stage oscillator portion 68, it is possible to get a multiplication by N (i.e. the output clock frequency $f_1$ is N times the input clock frequency $f_0$ /M), as long as n is an even number, by producing combinational logic having the following properties:

$$\phi_{OUT} = \sum_{i=1}^{n/2} [(\phi_{2i-1} \times \phi_{2i}) + (\phi_{2i-1}^* \times \phi_{2i}^*)] \quad \text{(Equation 1A)}$$

Here, of course, the "x" is an AND operation and the "+" is an OR operation. To create the combinational logic, the AND operation can be implemented with an AND gate, and the OR operation can be implemented with an OR gate, or logical equivalents thereof.

As a further example, with an n-stage oscillator portion 68, it is possible to get a multiplication by N (i.e. the output clock frequency $f_1$ is N times the input clock frequency $f_0$ /M), as long as n is an odd number, by producing combinational logic having the following properties:

$$\phi_{OUT} = (\phi_1 \times \phi_n) + \sum_{i=1}^{n-1} (\phi_i \times \phi_{i+1}) \quad \text{(Equation 1B)}$$

It should also be noted at this point that there is a synergistic combination between the multi-stage oscillator portion 68 and the combinational logic portion 70. In order to produce the desired 50% duty cycle for the output clock, the oscillator portion 68 is required. Then, by proper combination of the various phases produced by the oscillator portion 68, the combinational logic portion 70 can provide an output clock having a 50% duty cycle (i.e. it is "high" and "low" for the same amount of time in each cycle) at a number of desirable multiples and/or phases of the input clock frequency.

Figure 7A:
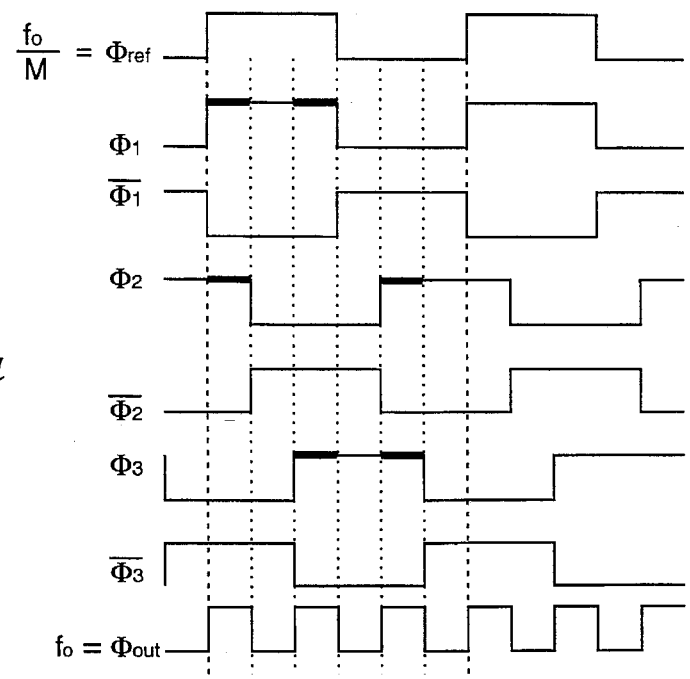
FIG. 7a and 7b are timing diagrams illustrating the operation of a phase locked loop of the present invention.

In FIG. 7a, a timing diagram is shown for a 3-stage oscillator portion 68 which can provide an output $f_1$ that is three times the frequency of the input clock. It should be noted that since there are an odd number of stages in this oscillator portion, the formula of Equation 1B should be used. In this instance, the following combinational logic in implemented by substituting n=3 into Equation 1B:

$$\phi out=(\phi1\times\phi3)+(\phi1\times\phi2)+(\phi2\times\phi3) \quad \text{(Equation 2)}$$

Figure 7B:
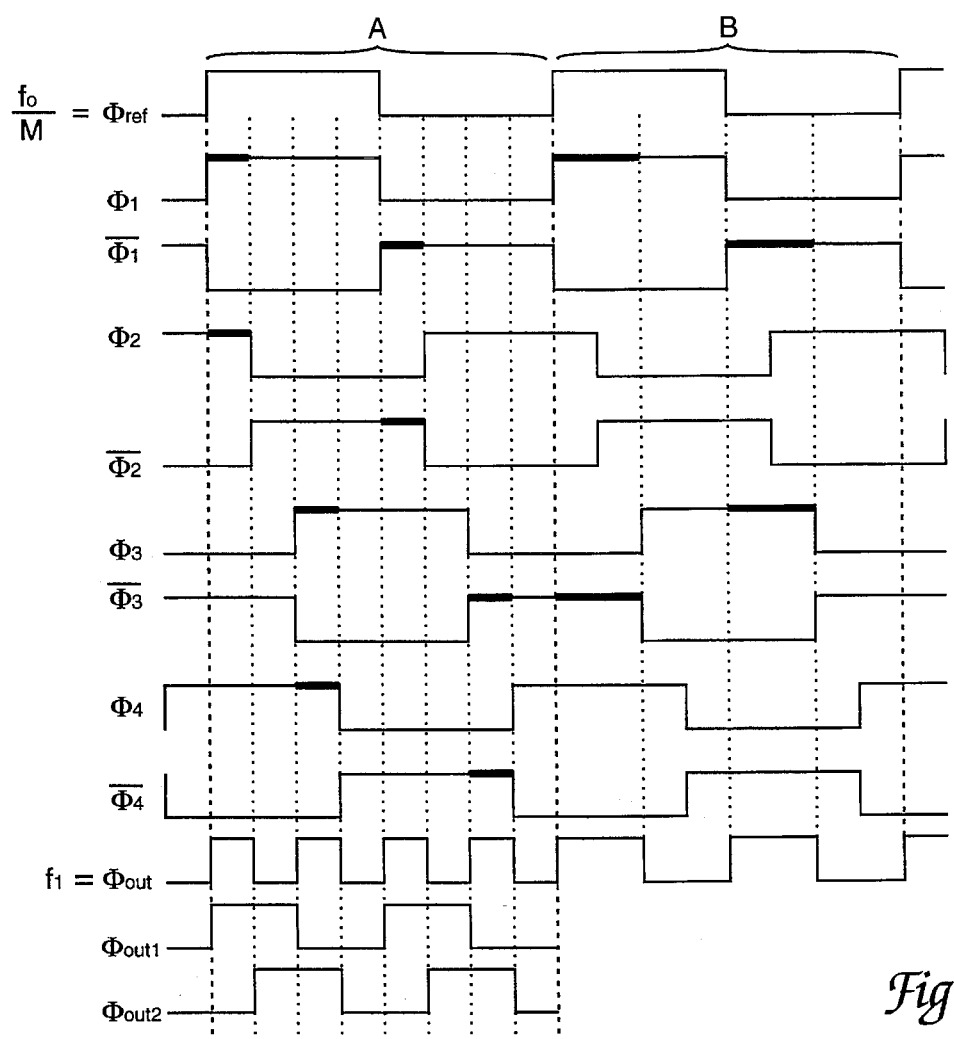

The portions of the signals being "ANDED" together are highlighted with darkened lines in the timing diagram of FIG. 7a. As noted, $\phi1$ is ANDED with $\phi2$, $\phi1$ is ANDED with $\phi3$, and $\phi2$ is ANDED with $\phi3$. The "ORING" of these AND operations results in the output clock FIG. 7b is used to illustrate several types of combinational logic for a 4-stage oscillation portion 68. More particularly, section A of FIG. 7b illustrates a four times multiplication, while section B illustrates a two times multiplication of the output clock $f_1$. It should also be noted that a one times multiplication can be provided by directly taking $\phi1$ as the output clock $f_1$. In other words, if $\phi1$ is used as the output clock, no combinational logic or a "null" combinational logic can be used to produce the output clock at a frequency $f_1=\phi1$.

To get multiplication by 2 (in the B portion of FIG. 7b) the following combinational logic is implemented:

$$\phi OUT=(\phi1\times\phi3^*)+(\phi1\times\phi3) \quad \text{(Equation 3)}$$

The darkened portions of the various wave forms are shown to illustrate the portions of those wave forms that are ANDED together to create the output wave form of the output clock at frequency $f_1$.

To produce a four times multiplication (in the A portion of FIG. 7b) the following combinational logic is implemented:

$$out=(\phi1\times\phi2)+(\phi3\times\phi4)+(100\ 1^*\times\phi2^*)+(\phi3^*\times\phi4^*) \quad \text{(Equation 4)}$$

It should be noted that this combinational logic is an instance of the general formula of Equation 1A for an n-stage oscillator portion 68, where n is an even number and where a multiplication by N is required. Again, the portions of the signals that are being ANDED are shown with darkened lines to help illustrate this concept.

It should also be noted that various phases of a VCO output clock can be provided. For example, and with reference to the timing diagram of FIG. 7b for a four-stage VCO implementation, it is a straightforward task to obtain both a $\phi OUT1 = \phi REF\times2$ and a $\phi OUT1=(\phi REF\times2)+90°$ can be obtained by appropriate combinational logic as follows:

$$\phi OUT1=(\phi1\times\phi3^*)+(\phi1^*\times\phi3) \quad \text{(Equation 5)}$$

$$\phi OUT2=\phi OUT\ 1+90°=(\phi2\times\phi4^*)+(\phi2^*\times\phi4) \quad \text{(Equation 6)}$$

The preceding examples therefore illustrate that both multiple clocks at multiple frequencies and multiple clocks at multiple clock phases can be produced with the present invention by providing appropriate combinational logic.

It should be further noted that there are number of ways of implementing the functionality of the divider 48, comparator 40, and loop filter 52 of FIG. 3 that are well-known to those skilled in the art. These alternate designs are considered equivalents within the scope of the present invention. Furthermore, there are several well-known designs for VCO oscillators which can serve as a multi-stage oscillator portion 68. These, too, are considered to be equivalents within the scope of the present invention as long as they are capable of producing appropriate clock phases for the combinational logic portion 70 of the present invention. A designer of ordinary skill in the art will be able to design combinational logic to produce appropriate output clock frequencies and phases for desired applications given the foregoing instructions. It should also be noted that those skilled in the art know that the functionality of combinations of discrete logic gates (such as AND, OR, etc. gates) can be implemented in functionally logical equivalents in integrated circuits without the use of such discrete logic gates.

While this invention has been described in terms of several preferred embodiments, there are alterations, permutations, and equivalents which fall within the scope of this invention as noted above. It is therefore intended that the following appended claims be interpreted as including all such alterations, permutations, and equivalents as fall within the true spirit and scope of the present invention.

I claim:

1. A phase locked loop comprising:
   a comparator responsive to an input clock and a VCO clock, said input clock having an input clock frequency and said VCO clock having a VCO clock frequency, said comparator being operative to compare a signal derived from said input clock frequency and a signal derived from said VCO clock frequency and to develop a comparator output signal in response thereto;
   a VCO controller responsive to said comparator output signal and operative to produce a VCO control signal; and
   a VCO including
   (a) a multi-stage oscillator portion configured to oscillate at said VCO clock frequency during a steady state condition under the control of said VCO control signal, said oscillator portion being operative to develop a plurality of clock phases at said VCO clock frequency, wherein said VCO control signal is responsive to one of said plurality of clock phases; and
   (b) a combinational logic portion responsive to at least some of said plurality of clock phases and operative to combine said at least some clock phases to create an output clock having an output clock frequency that is a multiple of said VCO clock frequency.

2. A phase locked loop as recited in claim 1 wherein said comparator output signal is of a first type when said input clock frequency is greater than said VCO clock frequency, and is of a second type when said input clock frequency is less than said VCO clock frequency.

3. A phase locked loop as recited in claim 2 wherein said VCO controller comprises a loop filter controlled by said comparator output signal.

4. A phase locked loop as recited in claim 1 wherein said multi-stage oscillator includes a plurality of latches, where an input of each latch except a first latch is coupled to an output of a preceding latch, and where an input of said first latch is coupled to an output of a last latch, where each of said latches provides a delay having a period controlled by said VCO control signal, said plurality of clock phases comprising outputs of said latches.

5. A phase locked loop as recited in claim 4 wherein said plurality of latches each include a pair of inputs and a corresponding pair of outputs such that a first output is a phase-delayed version of said first input and such that a second output is a phase-delayed version of said second input and which is a complement of said first output, wherein for each latch except said first latch a first input is coupled to a first output of a preceding latch and a second input is coupled to a second output of said preceding latch.

6. A phase locked loop as recited in claim 5 wherein there are an even number of latches, and wherein a first output of said last latch is coupled to a second input of said first latch, and wherein a second output of said last latch is coupled to a first input of said first latch.

7. A phase locked loop as recited in claim 5 wherein there are an odd number of latches, and wherein a first output of said last latch is coupled to a first input of said first latch, and wherein a second output of said last latch is coupled to a second input of said first latch.

8. A phase locked loop as recited in claim 5 wherein said plurality of clock phases include a plurality of clock phases taken from said first outputs of said latches, and a plurality of inverted clock phases taken from said second outputs of said latches.

9. A phase locked loop as recited in claim 1 wherein said combinational logic portion is operative to produce multiple output clocks.

10. A phase locked loop as recited in claim 9 wherein said output multiple clocks are at multiple frequencies.

11. A phase locked loop as recited in claim 10 wherein said multiple output clocks are at multiple clock phases.

12. A phase locked loop as recited in claim 1 further comprising a feedback divider coupling said VCO clock to said comparator such that said VCO clock frequency is a multiple of said input clock frequency as determined by a divisor provided by said feedback divider.

13. A voltage controlled oscillator comprising:
    a multi-stage oscillator portion configured to oscillate at a VCO clock frequency during a steady state condition under the control of a VCO control signal, said oscillator portion being operative to develop a plurality of clock phases at said VCO clock frequency, wherein said VCO control signal is responsive to one of said plurality of clock phases; and
    a combinational logic portion responsive to at least some of said plurality of clock phases and operative to combine said at least some clock phases to create an output clock having an output clock frequency that is a multiple of said VCO clock frequency.

14. A voltage controlled oscillator as recited in claim 13 wherein said multi-stage oscillator includes a plurality of latches, where an input of each latch except a first latch is coupled to an output of a preceding latch, and where an input of said first latch is coupled to an output of a last latch, where each of said latches provides a delay having a period controlled by said VCO control signal, said plurality of clock phases comprising outputs of said latches.

15. A voltage controlled oscillator as recited in claim 14 wherein said plurality of latches each include a pair of inputs and a corresponding pair of outputs such that a first output is a phase-delayed version of said first input and such that a second output is a phase-delayed version of said second input and is a complement relative to said first output, wherein for each latch except said first latch a first input is coupled to a first output of a preceding latch and a second input is coupled to a second output.

16. A voltage controlled oscillator as recited in claim 15 wherein there are an even number of latches, and wherein a first output of said last latch is coupled to a second input of said first latch, and wherein a second output of said last latch is coupled to a first input of said first latch.

17. A voltage controlled oscillator as recited in claim 15 wherein there are an odd number of latches, and wherein a first output of said last latch is coupled to a first input of said first latch, and wherein a second output of said last latch is coupled to a second input of said first latch.

18. A voltage controlled oscillator as recited in claim 15 wherein said plurality of clock phases include a plurality of clock phases taken from said first outputs of said latches, and a plurality of inverted clock phases taken from said second outputs of said latches.

19. A voltage controlled oscillator as recited in claim 15 further comprising a first multiplexer having an output coupled to a first input of said first latch and a second multiplexer having an output coupled to a second input of said first latch, where both said first multiplexer and said second multiplexer have a plurality of inputs coupled to a plurality of outputs of said plurality of latches, said first multiplexer and said second multiplexer being responsive to a selection signal such that one of a plurality of numbers of stages can be selected for said oscillator portion.

20. A voltage controlled oscillator as recited in claim 13 wherein said combinational logic comprises AND gates and OR gates.

21. A voltage controlled oscillator as recited in claim 20 wherein said combinational logic performs the following function for a multiplication by N of the VCO clock frequency for an n stage oscillator, where n is an even number:

$$\phi_{OUT} = \sum_{i=1}^{n/2} [(\phi_{2i-1} \times \phi_{2i}) + (\phi_{2i-1}^* \times \phi_{2i}^*)]$$

22. A voltage controlled oscillator as recited in claim 20 wherein said combinational logic performs the following function for a multiplication by N of the VCO clock frequency for an n stage oscillator, where n is an odd number:

$$\phi_{OUT} = (\phi_1 \times \phi_n) + \sum_{i=1}^{n-1} (\phi_i \times \phi_{i+1})$$

23. A voltage controlled oscillator as recited in claim 13 wherein said combinational logic portion is operative to produce multiple output clocks.

24. A voltage controlled oscillator as recited in claim 23 wherein said multiple clocks are at multiple frequencies.

25. A voltage controlled oscillator as recited in claim 23 wherein said multiple clocks are at multiple clock phases.

26. A method for multiplying an input clock frequency comprising:

applying an input clock at an input clock frequency to a delay chain;

developing a plurality of phase-shifted clocks by tapping into said chain of latches, wherein said input clock is responsive to one of said plurality of phase-shifted clocks; and combining said plurality of phase shifted clocks in combinational logic to produce an output clock that has an output clock frequency that is a multiple of said input clock frequency.

27. A method as recited in claim 26 wherein said step of combining said plurality of phase shifted clocks in combinational logic develops multiple output clocks.

28. A method as recited in claim 27 wherein said multiple output clocks are at multiple frequencies.

29. A method as recited in claim 27 wherein said multiple output clocks are at multiple clock phases.

30. A method for making a voltage controlled oscillator comprising:

producing a looped chain of delay elements as a portion of an electronic circuit to provide oscillation, where an output of a delay element is phase-shifted relative to an output of a preceding delay element;

producing combinational logic as a portion of said electronic circuit; and coupling a plurality of said outputs of said delay elements to said combinational logic such that an output frequency of an output signal of said combinational logic is a multiple of an oscillation frequency of said looped chain of delay elements, wherein said oscillation frequency is responsive to one of said outputs of said delay elements.

31. A method as recited in claim 30 wherein said delay elements comprise latches.

32. A method as recited in claim 31 wherein said combinational logic is operative to produce multiple output clocks.

33. A voltage controlled oscillator as recited in claim 32 wherein said output multiple clocks are at multiple frequencies.

34. A voltage controlled oscillator as recited in claim 32 wherein said multiple output clocks are at multiple clock phases.

* * * * *